United States Patent
Nishizawa et al.

(10) Patent No.: US 9,515,195 B2
(45) Date of Patent: *Dec. 6, 2016

(54) ORGANIC MOLECULAR MEMORY

(71) Applicant: Kabushiki Kaisha Toshiba, Tokyo (JP)

(72) Inventors: Hideyuki Nishizawa, Tokyo (JP); Shigeki Hattori, Kanagawa (JP); Masaya Terai, Tokyo (JP); Satoshi Mikoshiba, Kanagawa (JP); Koji Asakawa, Kanagawa (JP); Tsukasa Tada, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/703,075

(22) Filed: May 4, 2015

(65) Prior Publication Data

US 2015/0236171 A1    Aug. 20, 2015

Related U.S. Application Data

(63) Continuation of application No. 14/022,756, filed on Sep. 10, 2013, now Pat. No. 9,054,324, which is a
(Continued)

(30) Foreign Application Priority Data

Mar. 24, 2011  (JP) .................................. 2011-065294

(51) Int. Cl.
*H01L 29/792* (2006.01)
*H01L 29/51* (2006.01)
(Continued)

(52) U.S. Cl.
CPC ............. *H01L 29/792* (2013.01); *H01L 29/16* (2013.01); *H01L 29/42348* (2013.01);
(Continued)

(58) Field of Classification Search
CPC .. H01L 29/792; H01L 29/16; H01L 29/42328; H01L 29/513; H01L 29/517; H01L 29/518
See application file for complete search history.

(56) References Cited

U.S. PATENT DOCUMENTS 6,885,053 B1    4/2005   Tsujioka
6,947,321 B2    9/2005   Tanabe
(Continued)

FOREIGN PATENT DOCUMENTS

CN    101512333 A    8/2009
JP    4-225567       8/1992
(Continued)

OTHER PUBLICATIONS

International Search Report issued May 29, 2012 in Application No. PCT/JP2012/001956.
(Continued)

*Primary Examiner* — William Coleman
(74) *Attorney, Agent, or Firm* — Oblon, McClelland, Maier & Neustadt, L.L.P.

(57) ABSTRACT

An organic molecular memory of an embodiment includes a first conductive layer, a second conductive layer, and an organic molecular layer interposed between the first conductive layer and the second conductive layer, the organic molecular layer including variable-resistance molecular chains or charge-storage molecular chains, the variable-resistance molecular chains or the charge-storage molecular chains having electron-withdrawing substituents.

26 Claims, 20 Drawing Sheets

Related U.S. Application Data continuation of application No. PCT/JP2012/001956, filed on Mar. 21, 2012.

(51) Int. Cl.
  *H01L 29/423* (2006.01)
  *H01L 29/16* (2006.01)

(52) U.S. Cl.
  CPC .......... *H01L 29/513* (2013.01); *H01L 29/517* (2013.01); *H01L 29/518* (2013.01)

(56) References Cited

U.S. PATENT DOCUMENTS

| | | | |
|---|---|---|---|
| 7,723,513 B2 | 5/2010 | Yu et al. | |
| 7,829,927 B2 | 11/2010 | Bidan et al. | |
| 8,809,846 B2 | 8/2014 | Tada et al. | |
| 9,047,941 B2 * | 6/2015 | Nishizawa | G11C 13/0016 |
| 2002/0171148 A1 | 11/2002 | Chen | |
| 2003/0111670 A1 | 6/2003 | Misra et al. | |
| 2003/0122150 A1 | 7/2003 | Chen | |
| 2003/0227793 A1 | 12/2003 | Tsujioka | |
| 2004/0120180 A1 | 6/2004 | Rotenberg et al. | |
| 2005/0093045 A1 | 5/2005 | Tsujioka | |
| 2005/0274609 A1 | 12/2005 | Chen et al. | |
| 2006/0060836 A1 | 3/2006 | Zhang et al. | |
| 2006/0234418 A1 | 10/2006 | Ufert | |
| 2008/0012009 A1 | 1/2008 | Hashizume et al. | |
| 2008/0138635 A1 | 6/2008 | Chen et al. | |
| 2008/0191256 A1 | 8/2008 | Bidan et al. | |
| 2008/0290337 A1 | 11/2008 | Halik et al. | |
| 2010/0163108 A1 | 7/2010 | Bessho et al. | |
| 2012/0241713 A1 | 9/2012 | Nishizawa et al. | |

FOREIGN PATENT DOCUMENTS

| | | |
|---|---|---|
| JP | 2004-64062 | 2/2004 |
| JP | 2004-311792 | 11/2004 |
| JP | 2004-537845 | 12/2004 |
| JP | 2005-136324 | 5/2005 |
| JP | 2005-513786 | 5/2005 |
| JP | 2007-93991 | 4/2007 |
| JP | 2007-536748 | 12/2007 |
| JP | 2007-538409 | 12/2007 |
| JP | 2008-21685 | 1/2008 |
| JP | 2008-21814 | 1/2008 |
| JP | 2008-53631 | 3/2008 |
| JP | 2008-514032 | 5/2008 |
| JP | 2008-532310 | 8/2008 |
| JP | 2009-218244 | 9/2009 |
| JP | 2009-267209 | 11/2009 |

OTHER PUBLICATIONS

M. A. Reed, et al., "Molecular random access memory cell", Applied Physics Letters, vol. 78, No. 23, Jun. 4, 2001, pp. 3735-3737.

Chao Li, et al., "Fabrication approach for molecular memory arrays", Applied Physics Letters, vol. 82, No. 4, Jan. 27, 2003, pp. 645-647.

Qiliang Li, et al., "Capacitance and conductance characterization of ferrocene-containing self-assembled monolayers on silicon surfaces for memory applications", Applied Physics Letters, vol. 81, No. 8, Aug. 19, 2002, pp. 1494-1496.

Michael Galperin, et al., "Hysteresis, Switching, and Negative Differential Resistance in Molecular Junctions: A Polaron Model", Nano Letters, vol. 5, No. 1, 2005, pp. 125-130.

I.N. Hulea, et al., "Tunable Fröhlich polarons in organic single-crystal transistors", Nature Materials, vol. 5, Dec. 2006, pp. 982-986.

K. Henkel, et al., "Electrical investigations on meta/ferroelectric/insulator/semiconductor structures using poly[vinylidene fluoride trifluoroethylene] as ferroelectric layer for organic nonvolatile memory applications", Journal of Vacuum Science & Technology B, 27 2009, pp. 504-507.

Office Action issued Apr. 15, 2014 in Japanese Patent Application No. 2011-065294 with English language translation.

Supplementary Partial European Search Report issued Nov. 21, 2014 in European Patent Application No. 12760616.8, filed Mar. 21, 2012.

Office Action issued Oct. 28, 2014, in Japanese Patent Application No. 2011065294, filed Mar. 24, 2011 w/English translation.

M.A. Reed, et al., "Prospects for Molecular-Scale Devices", Electronic Devices Meeting, IEDM Technical Digest. International, Dec. 5, 1999, pp. 227-230, XP010372034.

Office Action received in Taiwanese Patent Application No. 101109862 filed Mar. 22, 2012 w/English translation.

Combined Office Action and Search Report issued Nov. 11, 2015 in Chinese Patent Application No. 201280009970.7 (with English translation and English translation of Category of Cited Documents).

U.S. Appl. No. 14/842,052, filed Sep. 1, 2015, Asakawa et al.

U.S. Appl. No. 14/843,229, filed Sep. 2, 2015, Nishizawa et al.

Extended European Search Report issued Jun. 10, 2016 in Patent Application No. 12760616.8.

Combined Office Action and Search Report issued May 5, 2015 in Chinese Patent Application No. 201280009970.7 (with English language translation and English translation of categories of cited documents).

\* cited by examiner

ORGANIC MOLECULAR MEMORY

CROSS-REFERENCE TO RELATED APPLICATION

This application is a Continuation of U.S. application Ser. No. 14/022,756, filed Sep. 10, 2013, now allowed, which was a continuation application based upon the International Application PCT/JP2012/001956, the International Filing Date of which is Mar. 21, 2012, the International Application is based upon and claims the benefit of priority from Japanese Patent Application No. 2011-065294, filed on Mar. 24, 2011, the entire contents of which are incorporated herein by reference.

FIELD

Embodiments described herein relate generally to organic molecular memories.

BACKGROUND

When organic molecules are used in memory cells, the memory cells can be made smaller in size, because organic molecules themselves are small in size. As a result, storage density of memory using molecules can be increased The operation of memory cell can be achieving the change between the low resistance state and the high resistance state, and the change is corresponding to the change of electric current. For this purpose, molecules having a function to change its resistance depending on the applied electric field or injected charges are introduced between upper and lower electrodes. To change the state, the voltage is applied between the upper and lower electrodes The difference of state can be detected by the electric current. In this manner, a memory cell is formed. In this manner, a memory cell is formed. Another operation of memory cell can be achieving the change of the stored charges in molecule between the channel (electrode) and the gate electrode of FET, and the change is corresponding to the change of drain current. For this purpose, molecules having a function to storing injected charges are formed on an electrode, and the charges injected from the electrode are stored in the molecule. To change the stored charges, the voltage is applied between the upper and lower electrodes. The charge-stored state can be detected by the drain current. Such attempts have also been made to form memory cells. Alternatively, molecules having a function to store injected charges are formed on an electrode, and the charges injected from the electrode are stored. The charge-stored state is read out. In this manner, a memory cell is formed.

In a small memory cell, the distances between the charges in the molecules and the surrounding electrodes are short. Therefore, charges are easily cleared from molecules due to movement of charges between the molecules and the electrodes. As a result, the charge retention time (the data retention time or life) of the organic molecular memory becomes shorter.

DETAILED DESCRIPTION

An organic molecular memory of an embodiment includes a first conductive layer, a second conductive layer, and an organic molecular layer interposed between the first conductive layer and the second conductive layer, the organic molecular layer including variable-resistance molecular chains or charge-storage molecular chains, the variable-resistance molecular chains or the charge-storage molecular chains having electron-withdrawing substituents.

The following is a description of embodiments, with reference to the accompanying drawings.

It should be noted that, in this specification, "variable-resistance molecular chain" means a molecule chain having a function to change its resistance, depending on whether an electric field exists or whether charges are injected thereinto.

Also, in this specification, "charge-storage molecular chain" means a molecular chain that has a function to store charges therein, and can switch between a charge-stored state and a no-charge-stored state by application and removal of external voltage.

Also, in this specification, "chemical bond" is a concept indicating covalent bond, ion bond, or metallic bond, but is not a concept indicting hydrogen bond or bond by van der Waals' forces.

First Embodiment

An organic molecular memory of this embodiment includes a first conductive layer, a second conductive layer, and an organic molecular layer interposed between the first conductive layer and the second conductive layer, the organic molecular layer including variable-resistance molecular chains or charge-storage molecular chains, the variable-resistance molecular chains or the charge-storage molecular chains having electron-withdrawing substituents.

According to this embodiment, as the electron-withdrawing substituents are introduced into the organic molecular layer, the relative permittivity of the organic molecular layer becomes higher. Therefore, charges in the organic molecular layer are hardly pulled out of the organic molecular layer, and the charge retention properties of the organic molecular memory (hereinafter also referred to simply as the molecular memory) are improved.

Figure 2:
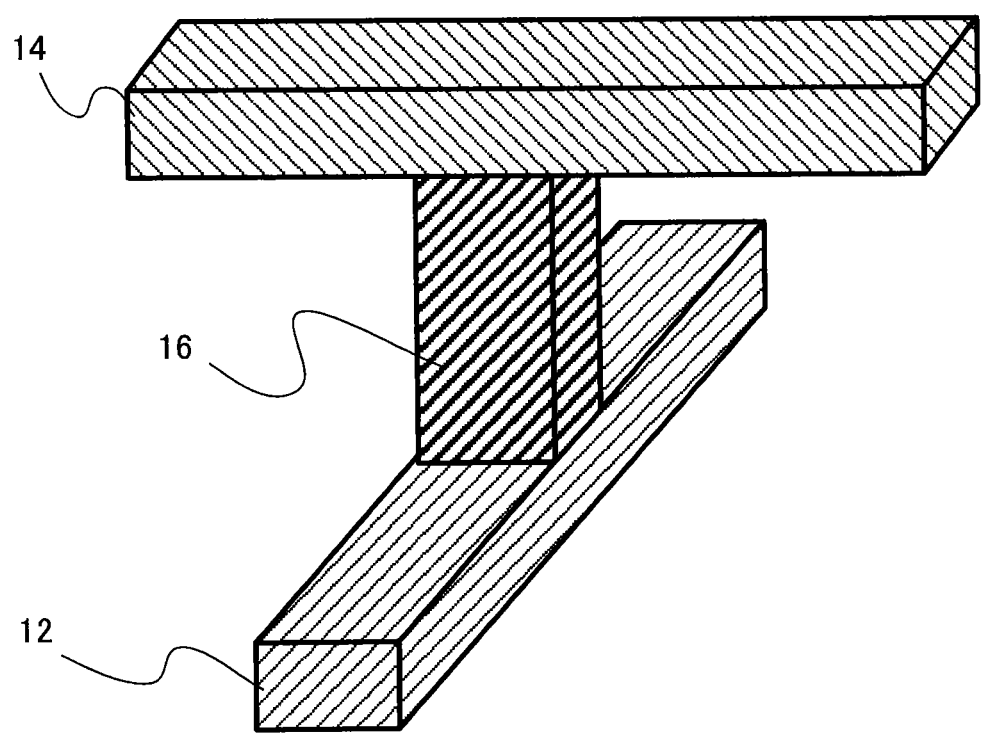
FIG. 2 is a schematic perspective view of an organic molecular memory of the first embodiment.
Figure 3:
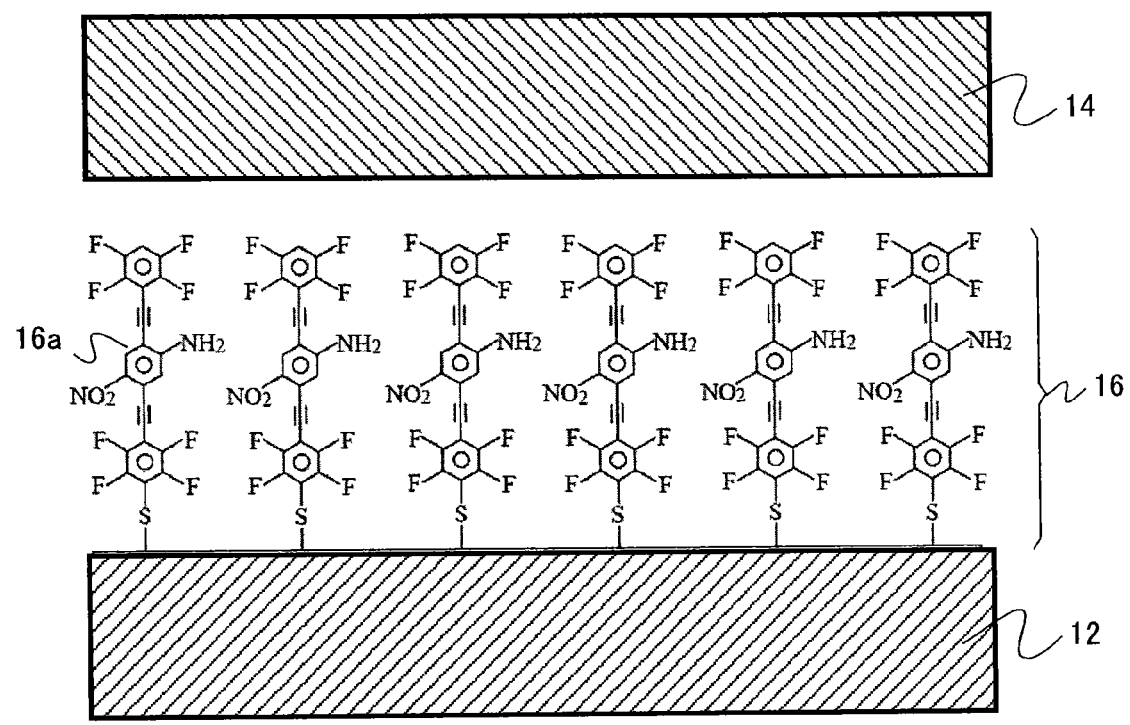
FIG. 3 is a schematic cross-sectional view of a memory cell portion of the organic molecular memory of the first embodiment.

FIG. 2 is a schematic perspective view of the organic molecular memory of this embodiment. FIG. 3 is a schematic cross-sectional view of a memory cell (molecular cell) portion of the organic molecular memory.

The molecular memory of this embodiment is a crosspoint molecular memory. As shown in FIGS. 2 and 3, a lower electrode interconnect (the first conductive layer) 12 is provided on an upper portion of a substrate (not shown), for example. An upper electrode interconnect (the second conductive layer) 14 is provided to be perpendicular to the lower electrode interconnect 12. The design rule of the electrode interconnects is around 5 to 20 nm, for example.

As shown in FIGS. 2 and 3, an organic molecular layer 16 is provided at an intersection portion between the lower electrode interconnect 12 and the upper electrode interconnect 14. The organic molecular layer 16 is interposed between the lower electrode interconnect 12 and the upper electrode interconnect 14. Variable-resistance molecular chains 16a with electron-withdrawing substituents form the organic molecular layer 16. The thickness of the organic molecular layer 16 is 1 to 20 nm, for example.

The organic molecular layer 16 is provided at each intersection points between lower electrode interconnects 12 and upper electrode interconnects 14 as shown in FIG. 2, for example, to form memory cells. With this arrangement, a memory cell array formed with memory cells is realized.

First, as shown in FIG. 3, the organic molecular layer 16 of this embodiment is formed with the variable-resistance molecular chains 16a with electron-withdrawing substituents. One end of each variable-resistance molecular chain 16a is chemically bound to the lower electrode interconnect 12. The variable-resistance molecular chains 16a extend from the lower electrode interconnect 12 toward the upper electrode interconnect 14.

The lower electrode interconnect 12 is formed on a silicon (Si) substrate (not shown) having the (110) plane as a surface. The lower electrode interconnect 12 is made of a metallic material such as gold (Au). The face of the lower electrode interconnect 12 in contact with the organic molecular layer 16 is the (111) plane, for example. The upper electrode interconnect 14 is made of a metallic material such as molybdenum (Mo).

Figure 1A:
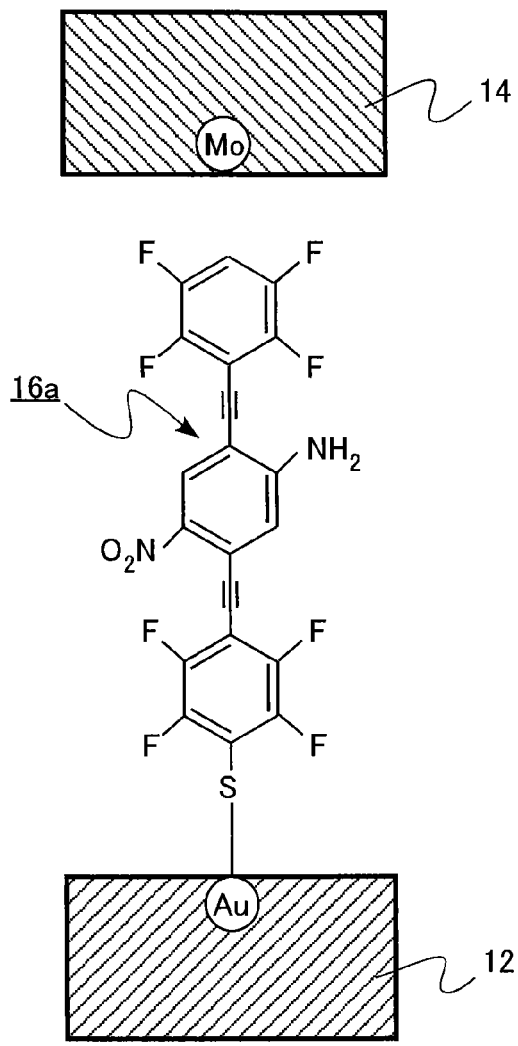
FIGS. 1A and 1B are diagrams showing molecular structures of organic molecules in memory cell portions according to a first embodiment.
Figure 1B:
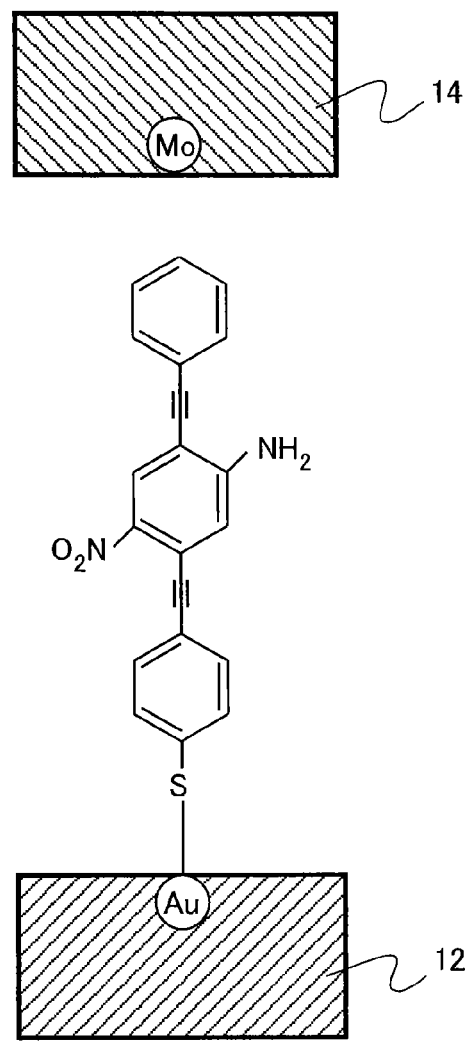

FIGS. 1A and 1B are diagrams showing molecular structures of organic molecules in memory cell portions. FIG. 1A shows organic molecules of this embodiment, and FIG. 1B shows organic molecules of a conventional art. In this embodiment, the organic molecular layer 16 of each memory cell portion contains variable-resistance molecular chains 16a to which electron-withdrawing substituents are bound.

The variable-resistance molecular chains 16a forming each organic molecular layers 16 of this embodiment have the molecular structures shown in FIG. 1A, for example. The variable-resistance molecular chain of FIG. 1A is a derivative of the variable-resistance molecular chain of the conventional art as shown in FIG. 1B, which is 4-[2-nitro-5-amino-4-(phenylethynyl)phenylethynyl]benzenethiol. A variable-resistance molecular chain having the molecule structure shown in FIG. 1B is also called a "tour wire".

A thiol group exists as a linker at one end of each of the variable-resistance molecular chains of FIGS. 1A and 1B, and a sulfur atom (S) and a gold atom (Au) in the surface of the lower electrode interconnect 12 are chemically bound together. Here, "linker" means a portion that secures a molecule to an electrode (a conductive layer) through chemical bond.

Gold atoms in the surface of the lower electrode interconnect 12 and thiol groups are bound together in this manner, to form each organic molecular layer 16 that is a so-called self-assembled monolayer (SAM). Meanwhile, the benzene ring at the other end of each variable-resistance molecular chain 16a is not chemically bound to molybdenum (Mo) atoms in the surface of the upper electrode 14.

Further, in the variable-resistance molecular chain of FIG. 1A, fluorine atoms (F) that are electron-withdrawing substituents are bound to the two upper and lower benzene rings that sandwich a benzene ring to which an amino group and a nitro group are bound.

Here, each variable-resistance molecular chain 16a is a molecule chain having a function to change its resistance, depending on whether an electric field exists or whether charges are injected thereinto. For example, each variable-resistance molecular chain having the molecular structure shown in FIG. 1A or 1B, can switch between a low-resistance state and a high-resistance state through voltage application between both ends. These changes in the resistance state are used to realize a memory cell.

In this embodiment, each variable-resistance molecular chain contains electron-withdrawing substituents, as shown in FIG. 1A. Having electron-withdrawing substituents in this manner, the variable-resistance molecular chains of this embodiment have a flexible, large electric dipole moment. Because of this, the organic molecular layer 16 has higher relative permittivity than that in a case where the variable-resistance molecular chain of FIG. 1B is used, for example. As a result, the charge retention properties of the organic molecular memory are improved.

The relative permittivity of the organic molecular layer 16 can be appropriately set by adjusting the molecular structures, placement density, and the like of the variable-resistance molecular chains 16a in the organic molecular layer 16.

Figure 4:
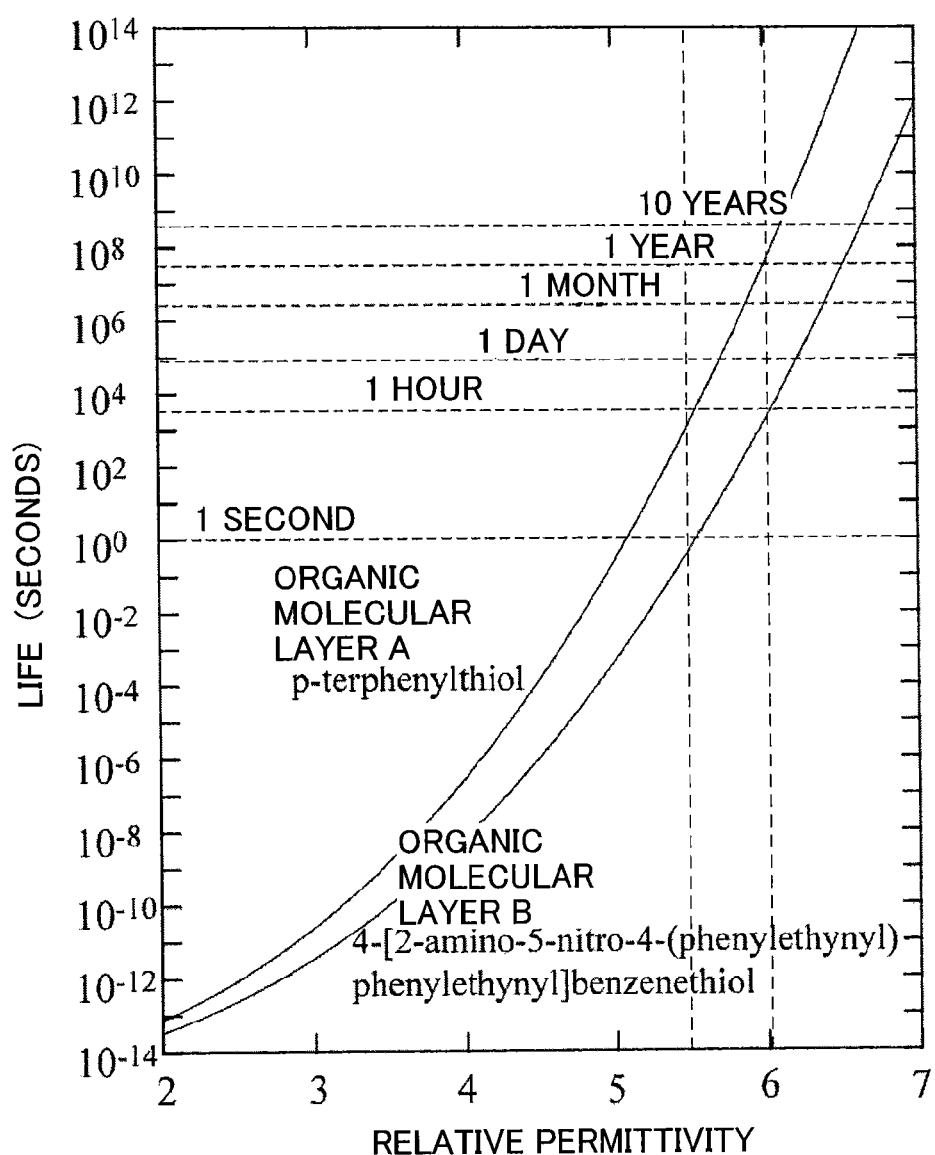
FIG. 4 shows graphs each representing the relationship between the relative permittivity and life of an organic molecular layer.
Figure 5A:
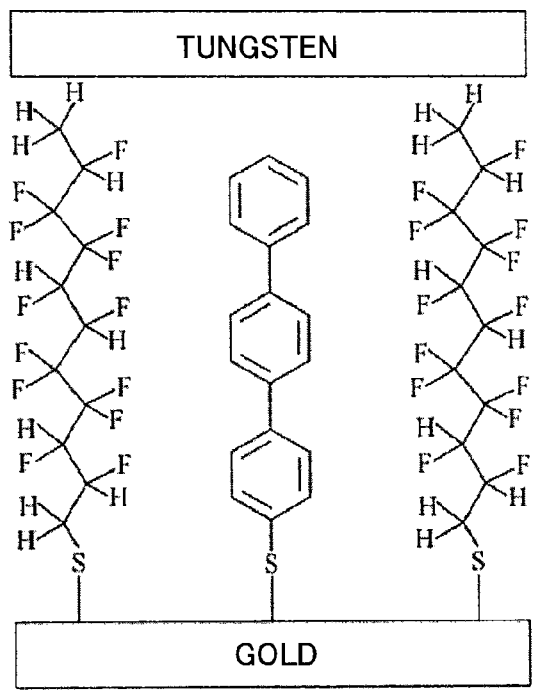
FIGS. 5A and 5B are diagrams showing the molecular structures of the organic molecular layers used in the measurement illustrated in FIG. 4.
Figure 5B:
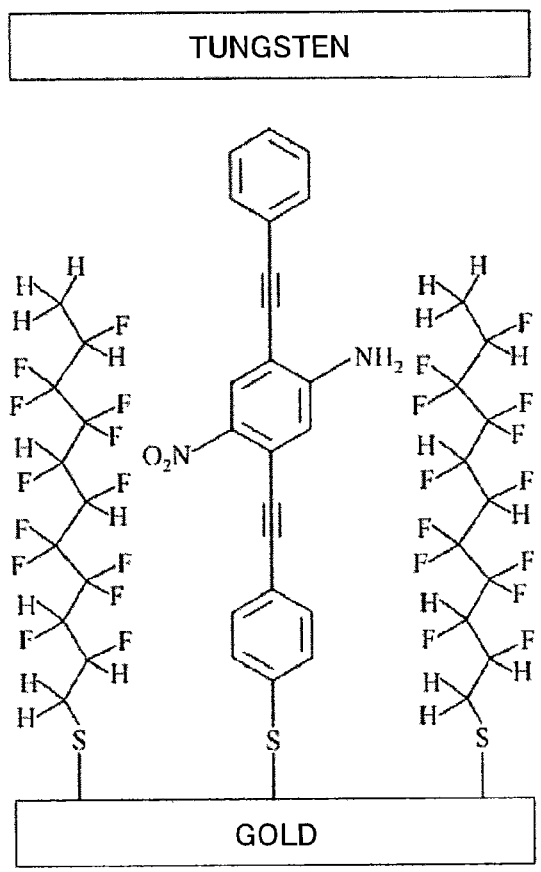

FIG. 4 shows graphs each representing the relationship between the relative permittivity and life (charge retention time) of an organic molecular layer. FIGS. 5A and 5B are diagrams showing the molecular structures of the organic molecular layers used in the measurement illustrated in FIG.

4. The graphs shown in FIG. 4 were calculated by using the later shown equation (2) based on the results obtained from the later described measurement (Measurement 1 and Measurement 2). It should be noted that the optical phonon frequency, $10^{15}$ ($s^{-1}$), which is the theoretical upper limit, is used as the constant term $P_0$ of the equation (2). Therefore, the constant term represents the lower limit of the retention time.

FIG. 4 shows the charge retention times of the two organic molecular layers of FIGS. 5A and 5B where the relative permittivity of each of the organic molecular layers is changed. Specifically, the two samples are: the organic molecular layer of FIG. 5A (the organic molecular layer A in FIG. 4) that is formed with p-terphenylthiol, which is variable-resistance molecular chains, and fluoroalkylthiol with electron-withdrawing substituents; and the organic molecular layer of FIG. 5B (the organic molecular layer B in FIG. 4) that is formed with 4-[2-amino-5-nitro-4-(phenylethynyl)phenylethynyl]benzenethiol, which is variable-resistance molecular chains with electron-withdrawing substituents, and fluoroalkylthiol(fluoroalkyl group) with electron-withdrawing substituents. Each of the two samples is interposed between gold as the lower electrode and tungsten as the upper electrode. The quantitative ratio between the variable-resistance molecular chains and the fluoroalkylthiol with electron-withdrawing substituents is varied, to change the relative permittivity of each of the organic molecular layers.

As shown in FIG. 4, when the relative permittivity of an organic molecular layer becomes 5.5 or higher, the charge retention time is approximately 1 second, and preferred characteristics of a memory can be achieved. Further, when the relative permittivity becomes 6.0 or higher, the charge retention time exceeds one hour, and a more preferable charge retention time of a memory can be realized. The charge retention time here is the period of time in which 37% of the initial characteristics change, and the measurement temperature is room temperature (300 K).

The relative permittivity of each of the organic molecular layers forming an organic molecular memory can be evaluated by applying an AC bias between the lower electrode interconnect and the upper electrode interconnect, and measuring the capacitance. At this point, the organic molecular layer thickness required for the relative permittivity calculation can be determined by observation with a TEM (Transmission Electron Microscope).

In the following, effects of this embodiment are described. It is considered that charges from the organic molecules in a memory cell interposed between electrodes (conductive layers) are cleared due to the following two mechanisms: 1) tunneling injection of charges of the opposite sign from the electrodes; and 2) hopping of charges from the molecules into the electrodes.

In this embodiment, the variable-resistance molecular chains forming an organic molecular layer has electron-withdrawing substituents. Accordingly, the relative permittivity of the organic molecular layer becomes higher, and clearing of charges due to the above described mechanisms 1) and 2) is restrained.

First, the mechanism 1) is described. Charges are easily cleared by tunneling injection of charges of the opposite sign from the electrodes, because the electric field induced by the charges in the organic molecules is strong. Due to a strong electric field, the energy barrier between the molecules and the electrodes becomes lower, and the tunneling probability becomes higher. Therefore, charges are easily cleared from the organic molecular layer.

Figure 6:
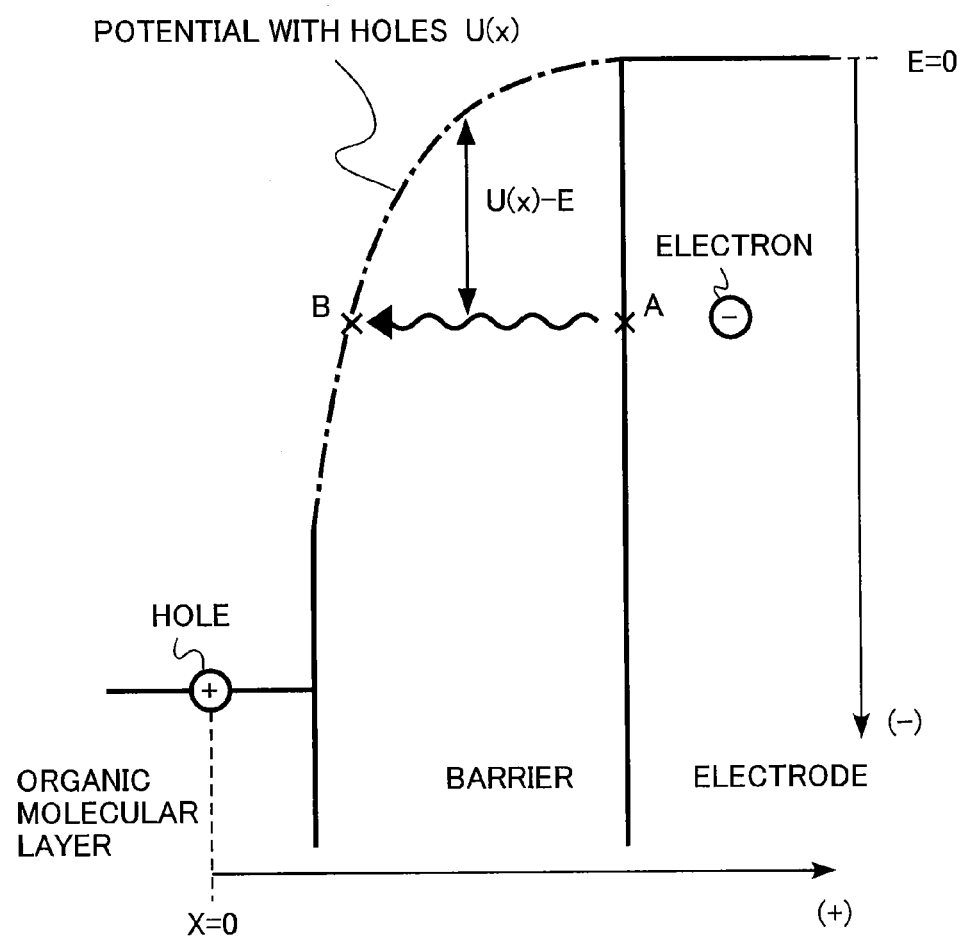
FIG. 6 is a diagram for explaining an effect of the first embodiment.

FIG. 6 is a diagram for explaining an effect of this embodiment. As shown in FIG. 6, when charges (holes in FIG. 6) exist in an organic molecular layer, carriers (electrons in the drawing) having charges of the opposite sign in the electrodes and the charges in the organic molecular layer attract each other. Accordingly, the potential barrier between the organic molecular layer and the electrodes becomes lower.

Where the potential barrier is represented by U(x), the probability that charges with an energy E in the electrode tunnel into the organic molecular layer is expressed by the following equation (1):

$$T \propto \exp\left(-\frac{4\pi}{h}\int_A^B \sqrt{2m(U(x)-E)}\, dx\right) \quad \text{[Equation (1)]}$$

Here, π represents the circumference ratio, h represents the Planck's constant, m represents the effective mass of charges, and A and B are the two points where the potential U(X) has the value of the energy E and serve as the start point (A) and the end point (B) of the tunneling.

As can be seen from the equation (1), the tunneling probability becomes higher, as the distance between A and B (the potential width) becomes shorter and the difference between the potential and the energy (U(X)–E) becomes smaller. The distance between A and B becomes shorter as the change in U(X) becomes larger. Since the change in U(X) corresponds to the electric field, the distance between A and B becomes longer and the tunneling probability becomes lower as the electric field becomes weaker.

Therefore, to restrain clearing of charges due to tunneling and facilitate charge retention, weakening the electric field is essential. As can be seen from the Maxwell's equations (the flux density conservation side), the electric field can be weakened by increasing the relative permittivity between the charges in the organic molecular layer and the electrodes. The portion between the charges in the organic molecular layer and the electrodes is the organic molecular layer. Therefore, by increasing the relative permittivity of the organic molecular layer, clearing of charges due to tunneling can be restrained.

Figure 7:
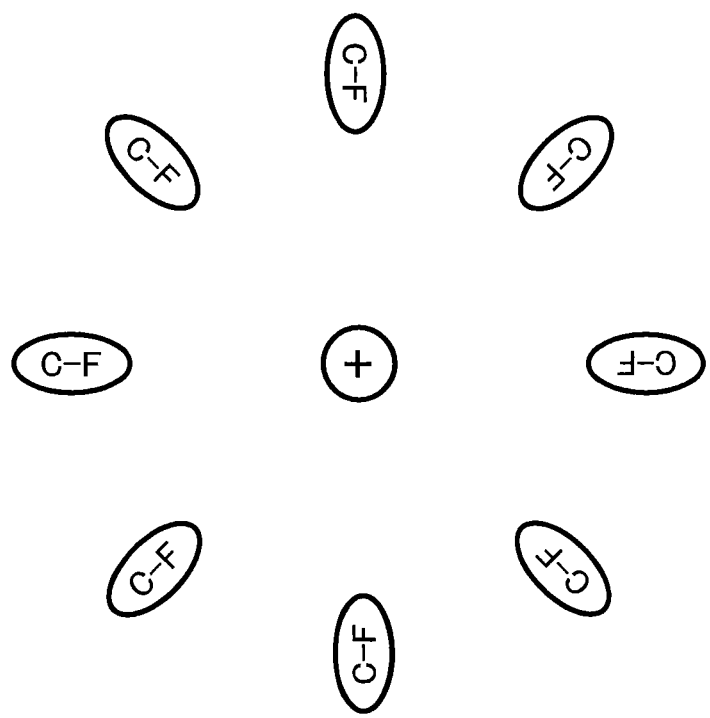
FIG. 7 is a diagram for explaining an effect of the first embodiment.

FIG. 7 is a diagram for explaining an effect of this embodiment. Specifically, FIG. 7 is a schematic cross-sectional view of a region in which charges are stored in a variable-resistance molecular chain, taken along a direction perpendicular to the molecular chain. C—F bonds in the surrounding area schematically represent bonds having dipoles introduced by this embodiment, or carbon and fluorine atoms. Some other kinds of dipoles may be used.

In this embodiment, fluorine atoms (F) as electron-withdrawing substituents are bound to variable-resistance molecular chains forming an organic molecular layer, as shown in FIG. 1A, for example. Therefore, the C—F bonds serve as electric dipoles. The electric dipoles are oriented in the direction of the electric field induced by the charges (holes in this case) stored in the organic molecular layer. In other words, the direction of the electric dipole moment is changed by the electric field induced by the charges introduced inside. Here, the holes are delocalized in the longitudinal direction of the molecular chains, and the C—F bonds are oriented to the holes. More specifically, the C—F bonds of each molecular chain adjacent to a molecular chain having hole charges stored therein rotate about a rotational axis extending in the longitudinal direction of the molecular chains. Accordingly, the C—F bonds are oriented in the direction of the electric field induced by the holes.

In this embodiment, electron-withdrawing substituents are bound to the variable-resistance molecular chains forming an organic molecular layer as described above. In this manner, the relative permittivity of the organic molecular layer is increased, and the electric field is made smaller.

Figure 8:
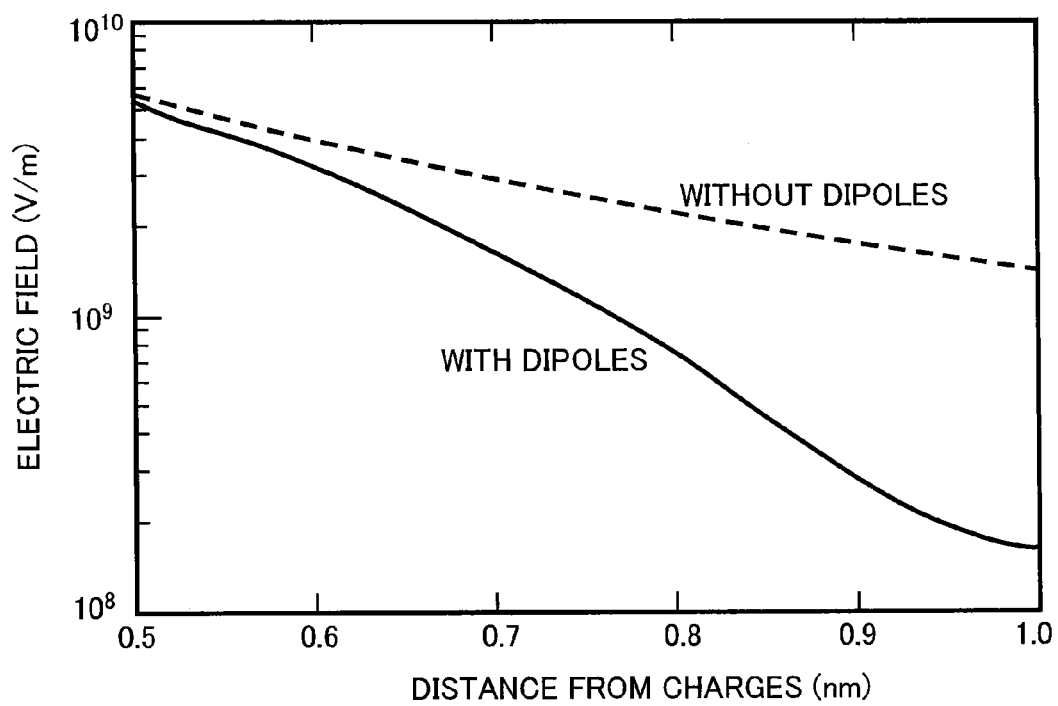
FIG. 8 is a diagram for explaining an effect of the first embodiment.

FIG. 8 is a diagram for explaining an effect of this embodiment. FIG. 8 shows the results of simulations performed to check the relationship between the distance from charges and the strength of an electric field in an organic molecular layer.

It is assumed here that the charges are holes, and the electric dipoles are C—F bonds. The molecules are arranged in a two-dimensional square lattice (lattice constant a=0.6 nm), and the Z-axis is in the longitudinal direction of the molecules. It is assumed that the center z of the longitudinal direction of the molecules is set at 0, and the charges are introduced into the center. Also, the electric dipoles exist in the positions expressed as z=+c/−c in the molecules, and are oriented in the direction of the electric field induced by the charges. Here, c is 0.7 nm. Specifically, the charges exist in the middle one of three benzene rings, and the electric dipoles exist in the upper and lower two benzene rings.

As can be seen from FIG. 8, the electric field is made smaller and becomes weaker as the electric dipoles exist. Accordingly, clearing of the charges due to tunneling can be restrained.

Figure 9:
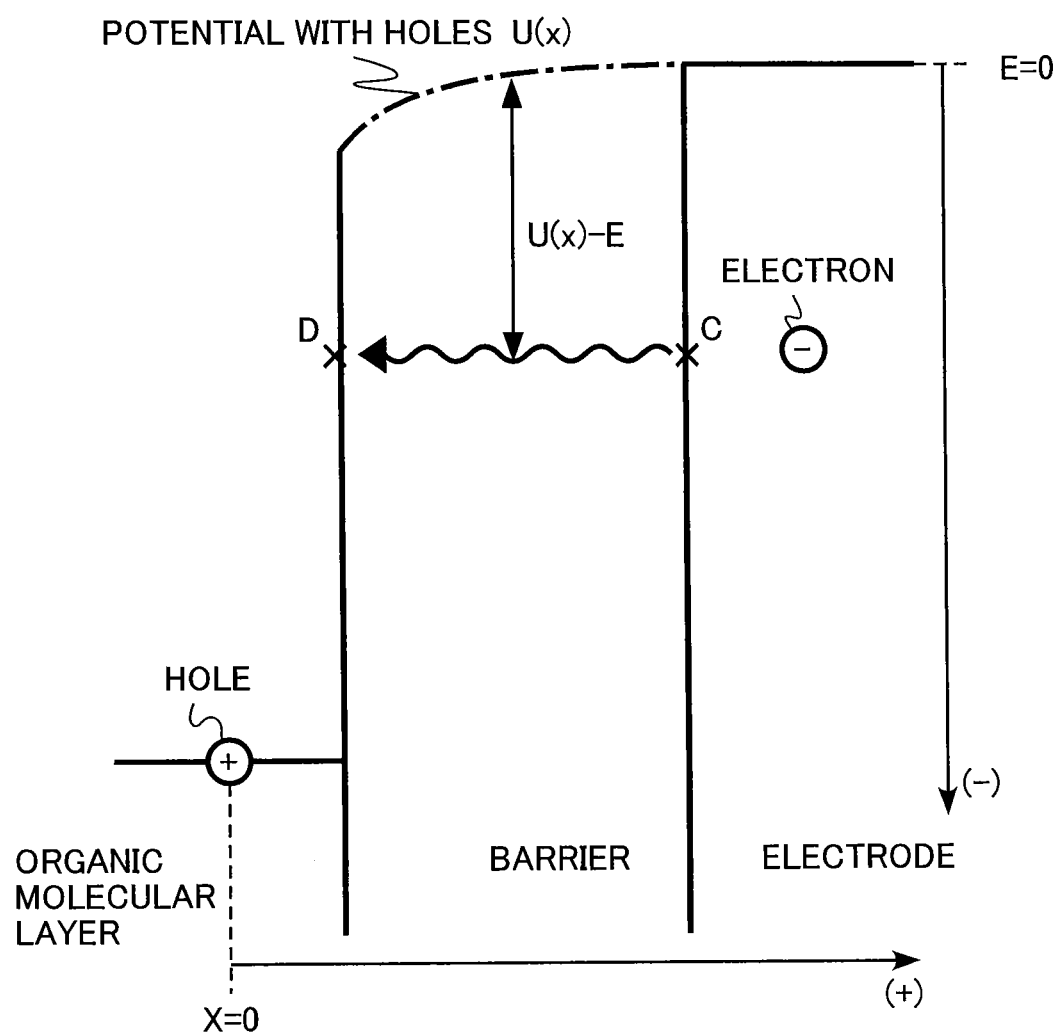
FIG. 9 is a diagram for explaining an effect of the first embodiment.

FIG. 9 is a diagram for explaining an effect of this embodiment. FIG. 9 is a diagram showing a change in the potential barrier in a case where an organic molecular layer has a higher relative permittivity than that of FIG. 6.

In a case where charges having the same energy E as that of FIG. 6 tunnel from the electrodes into the organic molecular layer, the charges need to pass through the start point C and the end point D of the tunneling. The distance between C and D is longer than the distance between A and B of FIG. 6, and the difference between the potential and the energy (U(X)−E) is larger than that of FIG. 6. Therefore, the tunneling probability is lower than that of FIG. 6. Accordingly, the charge retention time becomes longer.

Next, the mechanism (2) is described. Where electric dipoles exist, the potential barrier becomes higher, and tunneling is restrained, as described above. Not only that, the polarization energy becomes larger. Accordingly, clearing due to escape of charges from the molecules to the electrodes by hopping is restrained.

Figure 10:
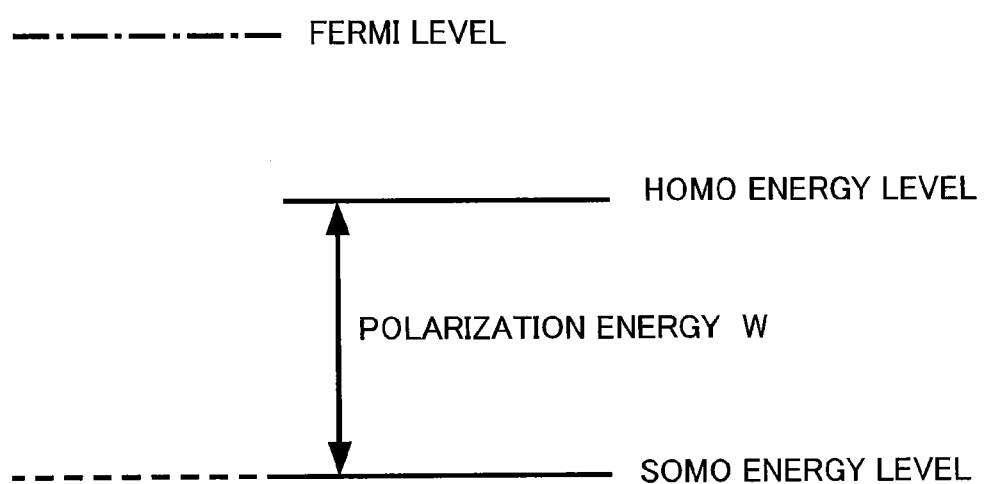
FIG. 10 is a diagram for explaining an effect of the first embodiment.

FIG. 10 is a diagram for explaining an effect of this embodiment.

Making an electric field smaller by electric dipoles is storing the energy of the electric field in the form of the polarization energy W of a dielectric material. The polarization energy W is the energy to be scattered around when charges are removed, and is equivalent to the difference between the HOMO (Highest Occupied Molecular Orbital) energy level and the SOMO (Singly Occupied Molecular Orbital) energy level from which one electron has been pulled out.

Therefore, the activation energy A required for the charges in an organic molecular layer to hop is equal to a half of the polarization energy W. Accordingly, by increasing the polarization energy W, the probability of outflow of charges hopping from molecules can be made lower. The outflow probability P can be expressed by the following equation (2):

$$P = P_0 \exp\left(-\frac{\Delta}{kT}\right) = P_0 \exp\left(-\frac{W}{2kT}\right) \quad \text{[Equation (2)]}$$

Here, $P_0$ represents the constant, and $\Delta$ represents the activation energy for removing charges.

In determining the polarization energy W, a local electric field, not a macroscopic electric field, needs to be used, with fluctuation of polarization at the molecular level being taken into account. Where $E_0$ represents the electric field without polarization, the local field E is expressed by the following equation (3):

$$E = \frac{\varepsilon + 2}{3} E_0 \quad \text{[Equation (3)]}$$

Accordingly, the polarization energy W is expressed by the following equation (4):

$$W = \int_0^D E dD = \varepsilon_r \varepsilon_0 \int_0^D E dE = \frac{\varepsilon_r \varepsilon_0}{2} \left(\frac{\varepsilon_r + 2}{3}\right)^2 E_0^2 \quad \text{[Equation (4)]}$$

As can be seen from the equation (4), the polarization energy W becomes larger as the relative permittivity becomes higher. As can be seen from the equation (2), the outflow probability P becomes lower as the polarization energy W becomes larger. Accordingly, hopping is restrained by increasing the relative permittivity. Thus, the charge retention time becomes longer.

In the following, the results of measurement of polarization energy and relative permittivity are described.

(Measurement 1)

A sample having a self-assembled film of terphenylthiol formed on a gold substrate is observed with a scanning tunneling microscope. As the top end of each molecule can be observed, a needle probe of the scanning tunneling microscope is put close to the top end of a molecule, and a bias is applied between the substrate and the needle probe. In this manner, the electric properties of a single molecule can be measured. Calculated from the result of measurement of current, the polarization energy $W_1$ is 0.36 eV. The relative permittivity $\in_1$ of the terphenylthiol molecular group is 3.1 (a literature-based value).

(Measurement 2)

A sample having a self-assembled film formed on a gold substrate is observed with a scanning tunneling microscope. In the self-assembled film, the compound ratio by weight of terphenylthiol is 5% while the compound ratio by weight of hexanethiol is 95%. Since the molecular chains of terphenylthiol are longer than those of hexanethiol, a structure having the top end of a terphenylthiol molecule protruding from the sample is observed. The needle probe of the scanning tunneling microscope is put close to the top end of the molecule, and a bias is applied between the substrate and the needle probe. In this manner, the electric properties of a single molecule can be measured. Calculated from the result of measurement of current, the polarization energy $W_2$ is 0.22 eV. The relative permittivity $\in_2$ of the hexanethiol is 2.3.

The effects of polarization energy can be confirmed by Measurement 1 and Measurement 2. The following equation (5) is established from the above measurement results:

$$\frac{W_1}{W_2} = \frac{0.36}{0.22} = 1.64 \quad \text{[Equation (5)]}$$

Meanwhile, according to the equation (4), the following equation (6) is established:

$$\frac{W_1}{W_2} = \frac{\varepsilon_1(\varepsilon_1+2)^2}{\varepsilon_2(\varepsilon_2+2)^2} = \frac{3.1(3.1+2)^2}{2.3(2.3+2)^2} = \frac{80.631}{48.668} = 1.66 \quad \text{[Equation (6)]}$$

The equation (5) and the equation (6) are the same within the margin of measurement error. In this manner, experiments confirm that the polarization energy (the activation energy) becomes larger as the relative permittivity is made higher.

As described above, according to this embodiment, clearing of charges due to movement of charges by tunneling and hopping is restrained. Accordingly, an organic molecular memory with excellent charge retention properties can be realized.

Variable-resistance molecular chains of this embodiment do not necessarily have the molecular structure illustrated in FIG. 1A, as long as electron-withdrawing substituents are bound to the variable-resistance molecular chains. First, as variable-resistance molecular chains to which electron-withdrawing substituents can be bound, molecules having a n(pi)-conjugated system extending in a one-dimensional direction can be used. For example, it is possible to use 4-[2-nitro-5-amino-4-(phenylethynyl)phenylethynyl]benzenethiol illustrated in FIG. 1B or a derivative thereof, or a paraphenylene derivative, an oligothiophene derivative, an oligopyrrole derivative, an oligofuran derivative, a paraphenylenevinylene derivative, or the like.

Figure 11A:
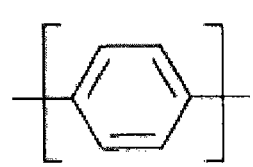
FIGS. 11A through 11F are diagrams showing an example of a molecular units that form organic molecules of the first embodiment.
Figure 11B:
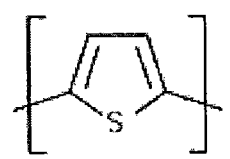
Figure 11C:
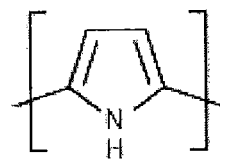
Figure 11D:
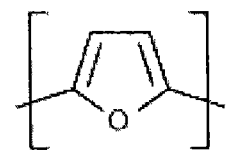
Figure 11E:
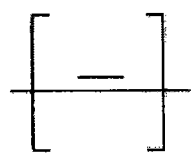
Figure 11F:
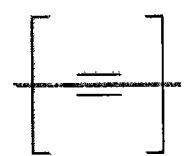
Figure 12A:
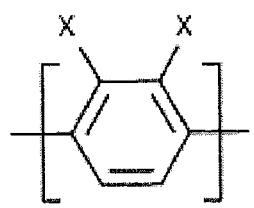
FIGS. 12A through 12E are diagrams showing an example of the molecular units of the first embodiment into which electron-withdrawing substituents are introduced.
Figure 12B:
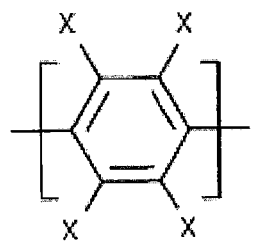
Figure 12C:
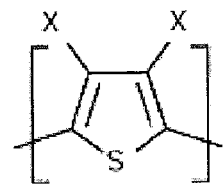
Figure 12D:
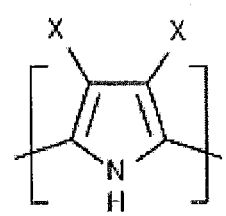
Figure 12E:
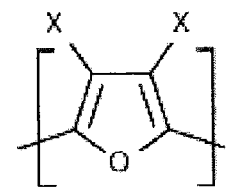

FIGS. 11A through 11F show an example of the molecular units that can form molecules having the n-conjugated system extending in a one-dimensional direction. FIG. 11A shows paraphenylene, FIG. 11B shows thiophene, FIG. 11C shows pyrrole, FIG. 11D shows furan, FIG. 11E shows vinylene, and FIG. 11F shows alkyne.

In a case where the length of the n-conjugated system is short, electrons injected from electrodes do not stay on the molecules, and the electrons simply pass by the molecules. Therefore, to store charges, each molecule preferably has a certain length, and the number of molecules in a —CH=CH— unit in a one-dimensional direction is preferably 5 or more, which is equivalent to 3 or more in the case of benzene rings (paraphenylene).

In a case where the n-conjugated system is long, a voltage drop due to charge conduction among the molecules becomes a problem. Therefore, the number in a —CH=CH— unit in a one-dimensional direction is preferably 20 or less (ten benzene rings=twice the spread width of polaron as the carrier of the n-conjugated system).

FIGS. 12A through 12E show an example of the molecular units into which electron-withdrawing substituents can be introduced. For example, those units are incorporated into part of the above described molecules having the n-conjugated system extending in a one-dimensional direction, to form variable-resistance molecular chains of this embodiment. In the drawings, X represents an electron-withdrawing substituent. The electron-withdrawing substituents may be fluorine atoms (F), chlorine atoms (Cl), bromine atoms (Br), iodine atoms (I), cyano groups, nitro groups, amino groups, hydroxyl groups, carbonyl groups, carboxyl groups, or the like. Highly anionic groups can form large electric dipoles. Therefore, to increase the relative permittivity, it is preferable to use fluorine atoms, chlorine atoms, or cyano groups.

The materials of the above described electrodes (the conductive layers) forming the organic molecular memory are not particularly limited to gold and molybdenum. In the electrode (the lower electrode interconnect 12 in this embodiment) to which the linker at one end of each variable-resistance molecular chain 16a is chemically bound, at least the regions to which the variable-resistance molecular chains 16a are chemically bound are preferably made of a material with which the one end of each of the variable-resistance molecular chains 16a easily forms a chemical bond, so as to form a self-assembled film. Also, in the electrode (the upper electrode interconnect 14 in this embodiment) on the side of the other end of each of the variable-resistance molecular chains 16a, at least the regions facing the variable-resistance molecular chains 16a are preferably made of a material that does not easily form chemical bonds with one ends of the variable-resistance molecular chains 16a, so as to form an organic molecular layer by using a self-organizing process after the electrode formation.

The preferred electrode material varies depending on the structure of the linker at the one end of each variable-resistance molecular chain 16a. For example, in a case where the one end is a thiol group as shown in FIG. 2, the electrode on the chemical bond side is preferably gold (Au), silver (Ag), copper (Cu), tungsten (W), tungsten nitride (WN), tantalum nitride (TaN), or titanium nitride (TiN). Among those materials, gold (Au), silver (Ag), and tungsten (W), which easily form chemical bonds, are particularly preferable. Meanwhile, the electrode at the other end is preferably tantalum (Ta), molybdenum (Mo), molybdenum nitride (MoN), or silicon (Si).

In a case where the one end is an alcohol group or a carboxyl group, for example, the electrode on the chemical bond side is preferably tungsten (W), tungsten nitride (WN), tantalum (Ta), tantalum nitride (TaN), molybdenum (Mo), molybdenum nitride (MoN), or titanium nitride (TiN). Among those materials, tantalum (Ta), tantalum nitride (TaN), molybdenum nitride (MoN), and titanium nitride (TiN), which easily form chemical bonds, are particularly preferable. Meanwhile, the electrode at the other end is preferably gold (Au), silver (Ag), copper (Cu), or silicon (Si).

In a case where the one end is a silanol group, for example, the electrode on the chemical bond side is preferably silicon (Si) or a metal oxide. Meanwhile, the electrode at the other end is preferably gold (Au), silver (Ag), copper (Cu), tungsten (W), tungsten nitride (WN), tantalum (Ta), tantalum nitride (TaN), molybdenum (Mo), molybdenum nitride (MoN), or titanium nitride (TiN).

Alternatively, graphene or carbon nanotube can be used as the electrode material.

Second Embodiment

While the organic molecular memory of the first embodiment includes variable-resistance molecular chains as memory elements having electron-withdrawing substituents, an organic molecular memory of this embodiment includes second organic molecules having electron-withdrawing substituents in each organic molecular layer, as well as first organic molecules including variable-resistance molecular chains as memory elements in each organic molecular layer. In this aspect, this embodiment differs from the first embodiment. In the following, the same explanations as those of the substrate, electrodes, variable-resistance molecular chains, electron-withdrawing substituents, and the like of the first embodiment will not be repeated.

Figure 13:
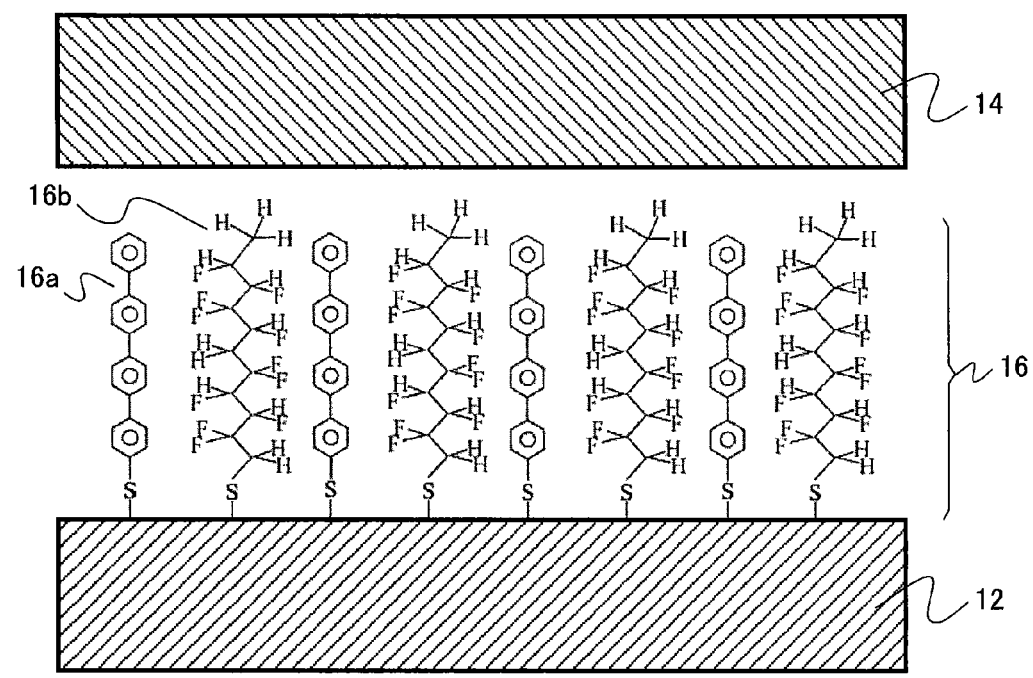
FIG. 13 is a schematic cross-sectional view of a memory cell portion of an organic molecular memory of a second embodiment.

FIG. 13 is a schematic cross-sectional view of a memory cell (molecular cell) portion of the organic molecular memory of this embodiment.

Each organic molecular layer 16 is formed with variable-resistance molecular chains 16a and organic molecules 16b having electron-withdrawing substituents that are fluorine atoms (F) in this example. The organic molecules 16b have different molecular structures from those of the variable-resistance molecular chains 16a.

As shown in FIG. 13, the variable-resistance molecular chains (first organic molecules) 16a are quaterphenylthiol, for example. Also, as shown in FIG. 13, the organic molecules (second organic molecules) 16b having electron-withdrawing substituents are fluoroalkylthiol, for example.

In this embodiment, changes in the resistance states of the variable-resistance molecular chains 16a are used to realize memory cells. The electric dipoles in the organic molecules 16b having electron-withdrawing substituents reduce the electric field induced by the charges in the variable-resistance molecular chains 16a. In other words, the existence of the organic molecules 16b having electron-withdrawing substituents in each organic molecular layer 16 increases the relative permittivity of each organic molecular layer 16. Accordingly, the charge retention properties of the organic molecular memory are improved by the same effects as those described in the first embodiment.

To allow the electric dipoles in the organic molecules 16b to make the electric field smaller, as opposed to the holes delocalized in the variable-resistance molecular chains 16a, the electron-withdrawing substituents in the organic molecules 16b preferably exist evenly in the straight-chain extending direction. For example, in the case of fluoroalkylthiol of FIG. 13, at least one fluorine atom (F) is preferably bound to every carbon atom. Also, a vinylidene fluoride derivative having the molecular structure of $[CF_2—CH_2]n$ is preferable.

To improve the charge retention properties of the organic molecular memory, the relative permittivity is preferably 5.5 or higher, or more preferably, 6.0 or higher, as in the first embodiment.

The relative permittivity of each organic molecular layer 16 can be appropriately set by adjusting the molecular structures of the variable-resistance molecular chains 16a, the molecular structures of the organic molecules 16b having electron-withdrawing substituents, the mixing ratio between the variable-resistance molecular chains 16a and the organic molecules 16b, the placement density, and the like in the organic molecular layer 16.

As the variable-resistance molecular chains 16a, molecules having the π-conjugated system extending in a one-dimensional direction can be used. For example, it is possible to use 4-[2-nitro-5-amino-4-(phenylethynyl)phenylethynyl]benzenethiol illustrated in FIG. 1B or a derivative thereof, or a paraphenylene derivative, an oligothiophene derivative, an oligopyrrole derivative, an oligofuran derivative, a paraphenylenevinylene derivative, or the like.

The molecular units illustrated in FIGS. 11A through 11F can be used as molecular units that form molecules having the π-conjugated system extending in a one-dimensional direction, for example.

The organic molecules 16b having electron-withdrawing substituents are not particularly limited. For example, the organic molecules 16b may be the variable-resistance molecular chains having electron-withdrawing substituents described in the first embodiment.

Figure 14:
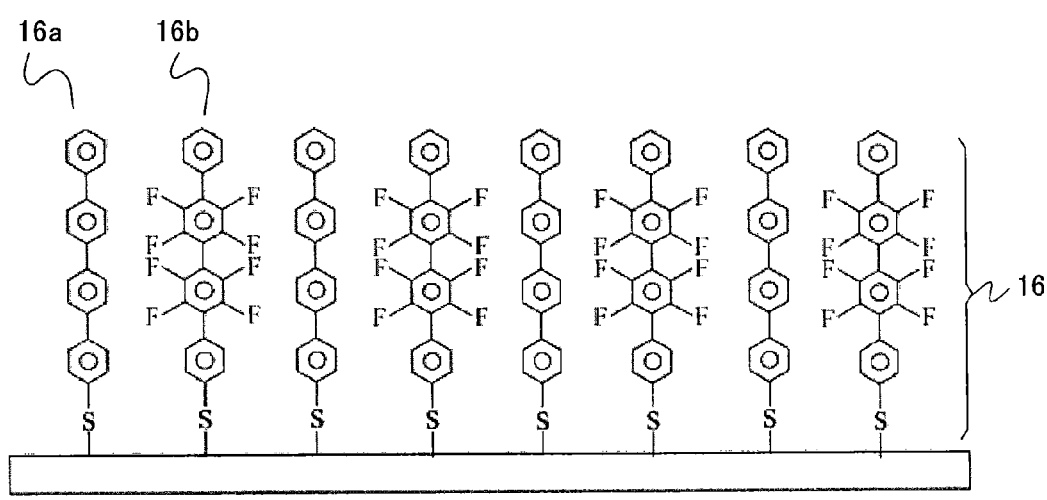
FIG. 14 is a diagram showing a modification of the second embodiment.

FIG. 14 is a diagram showing a modification of this embodiment. The variable-resistance molecular chains 16a are quaterphenylthiol, and the organic molecules 16b are quaterphenylthiol having electron-withdrawing substituents. As in this modification, the organic molecules 16b are made to have derivative structures of the variable-resistance molecular chains 16a, to advantageously facilitate the formation of each organic molecular layer 16 as a self-assembled film having two kinds of organic molecules mixed therein.

Alternatively, the variable-resistance molecular chains 16a may have electron-withdrawing substituents, as in the first embodiment. In such a case, the effects of the organic molecules 16b having electron-withdrawing substituents are added to the effects of the first embodiment. Accordingly, the charge retention properties of the organic molecular memory can be further improved.

Third Embodiment

An organic molecular memory of this embodiment is a stacked-gate organic molecular memory using charge-storage molecular chains, unlike the organic molecular memory of the first embodiment, which is a cross-point organic molecular memory using variable-resistance molecular chains. In the following, the same explanations as those of the actions and effects of electric dipoles, and the actions and effects to be achieved by increasing the relative permittivity, and the like described in the first embodiment will not be repeated.

Figure 15:
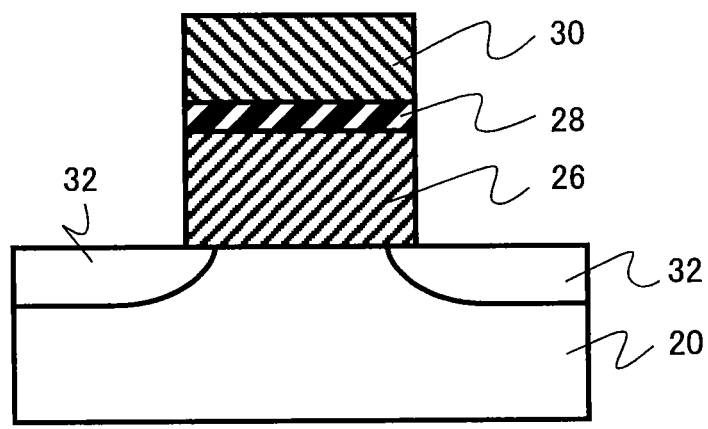
FIG. 15 is a schematic cross-sectional view of an organic molecular memory of a third embodiment.
Figure 16:
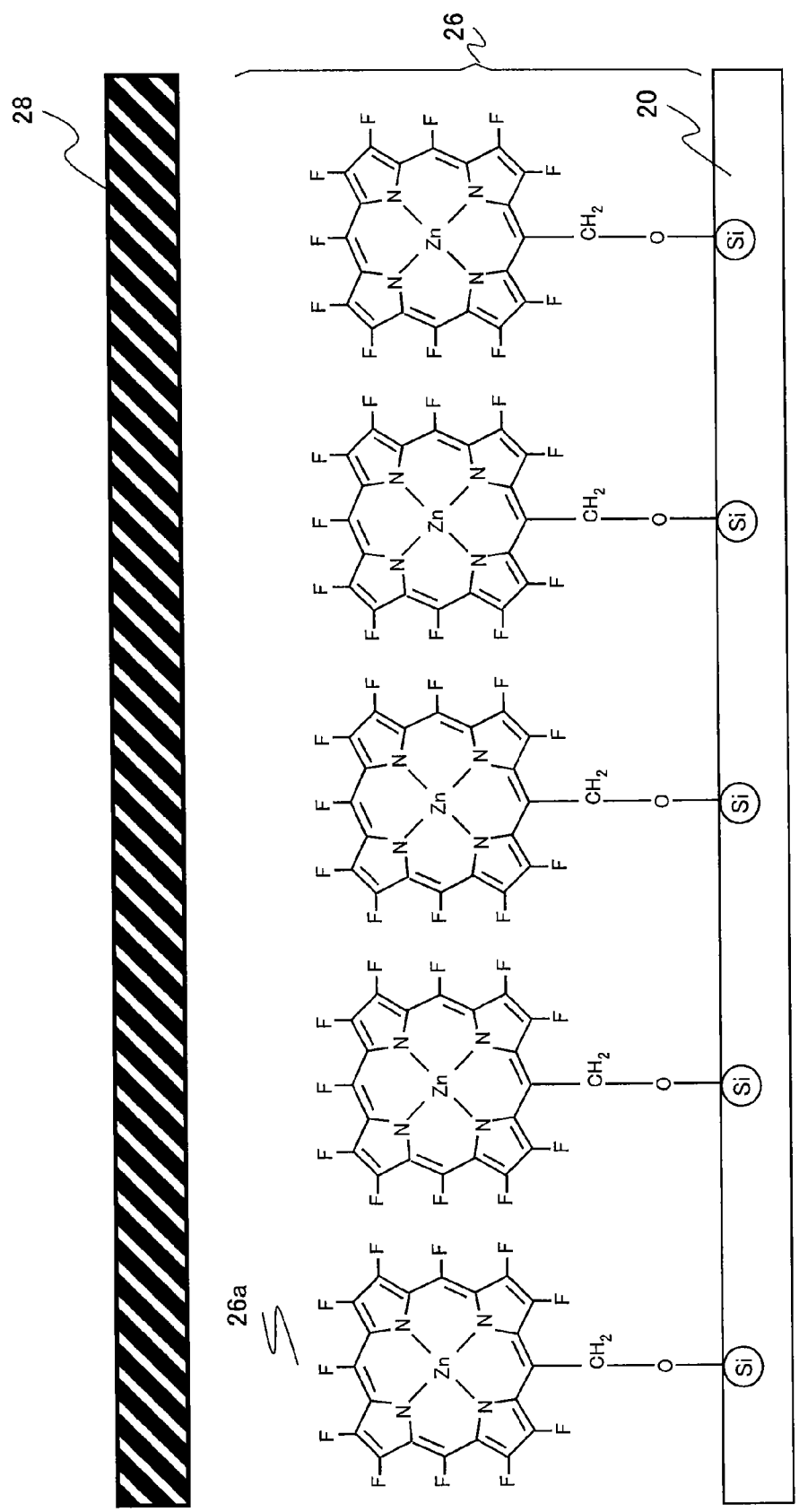
FIG. 16 is a schematic cross-sectional view of a memory cell portion of the organic molecular memory of the third embodiment.

FIG. 15 is a schematic cross-sectional view of the organic molecular memory of this embodiment. The organic molecular memory of this embodiment is a nonvolatile organic molecular memory of a stacked-gate type. FIG. 16 is a schematic cross-sectional view of a memory cell (molecular cell) portion of the organic molecular memory.

In the organic molecular memory of this embodiment, an organic molecular layer 26, a block insulating film (insulating layer) 28, and a gate electrode (a second conductive layer) 30 are formed on a silicon substrate (a first conductive layer or semiconductor layer) 20, for example. The organic molecular layer 26 formed above the silicon substrate (semiconductor layer) 20, an insulating layer 28 formed above the organic molecular layer 26 and the gate electrode 30 formed above the insulating layer 28. Source and drain regions 32 formed by diffusing an impurity are provided in portions of the silicon substrate 20 located on both sides of the stack structure.

The organic molecular layer 26 is formed with charge-storage molecular chains 26a. The charge-storage molecular chains 26a bond to the silicon substrate (semiconductor layer) 20. The charge-storage molecular chains 26a have a function to store charges in the molecular chains, and can switch between a charge-stored state and a no-charge-stored state by application and removal of external voltage. The organic molecular layer 26 functions as a charge-storage electrode.

The block insulating film 28 is a film stack of a silicon oxide film and a silicon nitride film, or a high-permittivity film, for example. The block insulating film 28 has a function to block movement of charges between the organic molecular layer 26 and the gate electrode 30.

In the organic molecular memory of this embodiment, a voltage is applied between the gate electrode 30 and the silicon substrate 20, to store charges into the organic molecular layer 26 or pull out the charges from the organic molecular layer 26. A memory cell functions, using changes in transistor threshold value depending on whether charges exist in the organic molecular layer 26.

Figure 17:
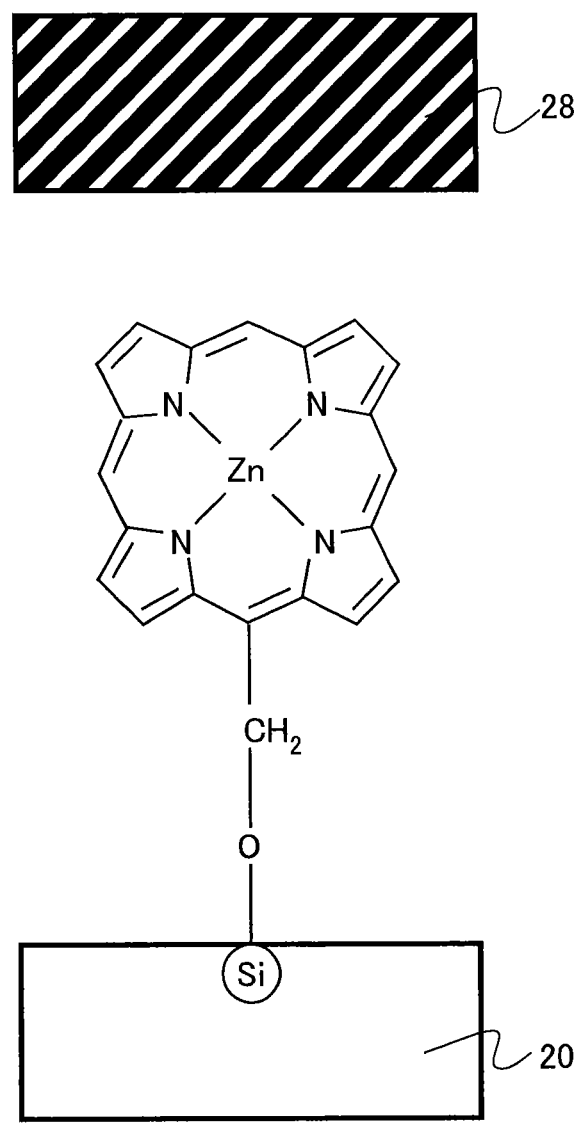
FIG. 17 is a diagram showing the molecular structure of an organic molecule of a conventional art.

FIG. 16 is a schematic cross-sectional view of a memory cell portion of the organic molecular memory of this embodiment. FIG. 17 illustrates organic molecules of a conventional art. In this embodiment, the organic molecular layer 26 of each memory cell portion contains organic molecules to which electron-withdrawing substituents are bound.

The charge-storage molecular chains 26a forming the organic molecular layer 26 of this embodiment have the molecular structures shown in FIG. 16, for example. The charge-storage molecular chains of FIG. 16 are made of a derivative of zinc porphyrin, which forms the charge-storage molecular chain of the conventional art shown in FIG. 17.

The oxygen atom (O) at one end of each of the charge-storage molecular chains of FIGS. 16 and 17 is chemically bound to a silicon atom (Si) of the silicon substrate 20. Silicon atoms in the surface of the silicon substrate 20 and oxygen atoms (O) are bound together in this manner, to form the organic molecular layer 26 that is a so-called self-assembled monolayer (SAM). Meanwhile, the other end of each of the charge-storage molecular chains 26a is not chemically bound to the block insulating film 28.

Further, in the charge-storage molecular chains of FIG. 16, fluorine atoms (F) that are electron-withdrawing substituents are bound to the zinc porphyrin.

In this embodiment, a memory cell is realized by using changes in the charge-stored state of the charge-storage molecular chains 26a. As the charge-storage molecular chains 26a have electron-withdrawing substituents, the charge-storage molecular chains 26a have a flexible, large electric dipole moment. With this arrangement, the electric field induced by the charges in the charge-storage molecular chains 26a is made smaller.

In other words, with the larger electric dipole moment, the relative permittivity of the organic molecular layer 26 is higher than that in the case where the charge-storage molecular chain shown in FIG. 17 is used. As a result, the charge retention properties of the organic molecular memory are improved by the same effects as those described in the first embodiment. Further, to improve the charge retention properties of the organic molecular memory, the relative permittivity is preferably 5.5 or higher, or more preferably, 6.0 or higher, as in the first embodiment.

The relative permittivity of the organic molecular layer 26 can be appropriately set by adjusting the molecular structures, placement density, and the like of the charge-storage molecular chains 26a in the organic molecular layer 26.

The charge-storage molecular chains of this embodiment are not limited to the molecular structures illustrated in FIG. 16, as long as electron-withdrawing substituents are bound to the charge-storage molecular chains.

Figure 18A:
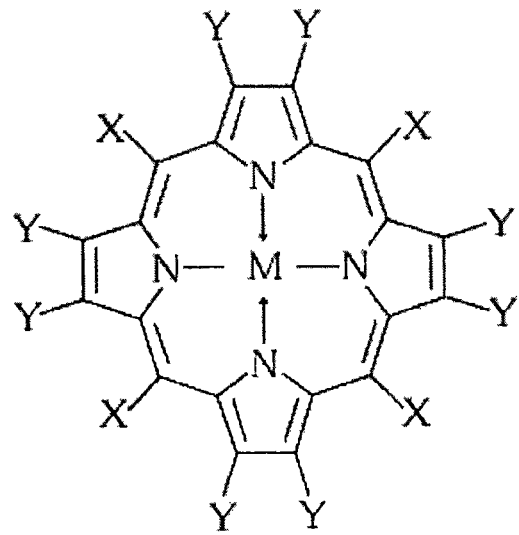
FIGS. 18A and 18B are diagrams showing an example of the molecular structures of charge-storage molecular chains of the third embodiment.
Figure 18B:
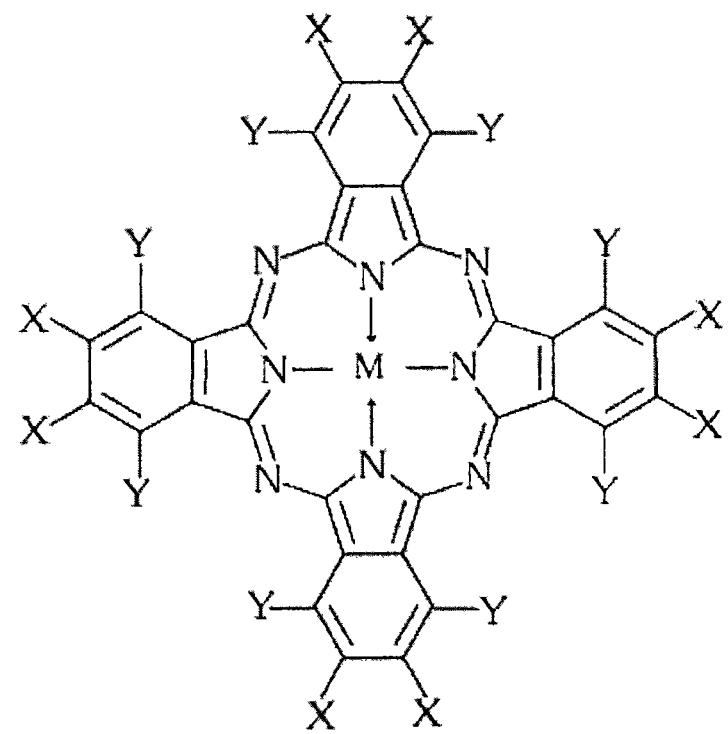
Figure 19A:
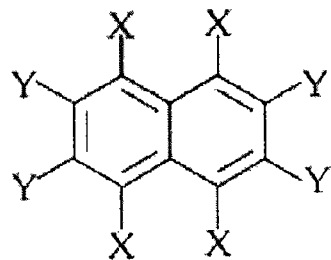
FIGS. 19A through 19F are diagrams showing an example of the molecular structures of the charge-storage molecular chains of the third embodiment.
Figure 19B:
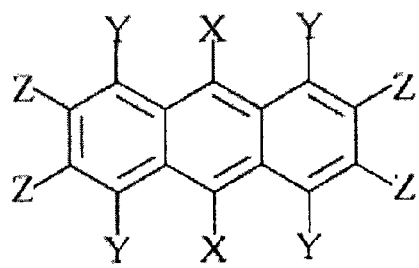
Figure 19C:
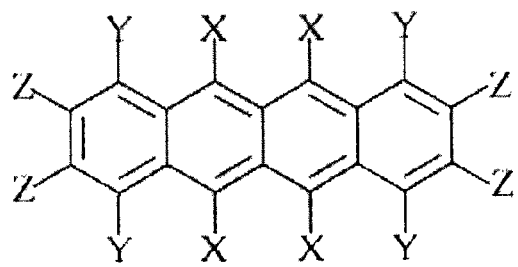
Figure 19D:
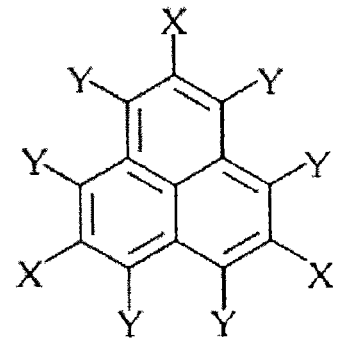
Figure 19E:
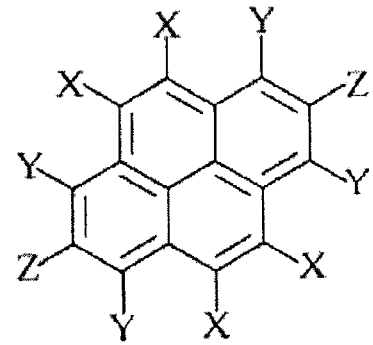
Figure 19F:
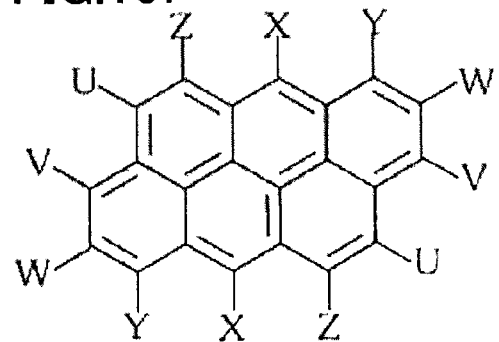

FIGS. 18A and 18B are diagrams showing an example of the molecular structures of the charge-storage molecular chains of this embodiment. FIG. 18A shows metalloporphyrin and a derivative thereof. In the drawing, M represents a metal atom or a metallic compound, such as zinc (Zn), iron (Fe), cobalt (Co), nickel (Ni), or copper (Cu). Also, in the drawing, X and Y represent electron-withdrawing substituents independent of each other, such as hydrogen atoms, halogen atoms, cyano groups, carbonyl groups, or carboxyl groups. However, at least some are electron-withdrawing substituents, and at least some are linkers to be selected depending on the material of the conductive layer subjected to binding.

FIG. 18B shows metallophthalocyanine and a derivative thereof. In the drawing, M represents a metal atom or a metallic compound, such as copper (Cu), cobalt (Co), iron (Fe), nickel (Ni), titanium oxide (TiO), or aluminum chloride (AlCl). Also, in the drawing, X and Y represent electron-withdrawing substituents independent of each other, such as hydrogen atoms, halogen atoms, cyano groups, carbonyl groups, or carboxyl groups. However, at least some are electron-withdrawing substituents, and at least some are linkers to be selected depending on the material of the conductive layer subjected to binding.

FIGS. 19A through 19F are diagrams showing an example of the molecular structures of the charge-storage molecular chains of this embodiment. FIGS. 19A through 19F show derivatives of condensation polycyclic molecules. In the drawings, X, Y, Z, U, V, and W represent electron-withdrawing substituents independent of one another, such as hydrogen atoms, halogen atoms, cyano groups, carbonyl groups, or carboxyl groups. However, at least some are electron-withdrawing substituents, and at least some are linkers to be selected depending on the material of the conductive layer subjected to binding.

Fourth Embodiment

In the organic molecular memory of the third embodiment, the charge-storage molecular chains serving as memory elements have electron-withdrawing substituents. On the other hand, an organic molecular memory of this embodiment includes second organic molecules having electron-withdrawing substituents in the organic molecular layer, as well as first organic molecules including charge-storage molecular chains serving as memory elements in the organic molecular layer. In this aspect, this embodiment differs from the third embodiment. In the following, the same explanations as those of the substrate, electrodes, charge-storage molecular chains, electron-withdrawing substituents, and the like of the third embodiment will not be repeated.

Figure 20:
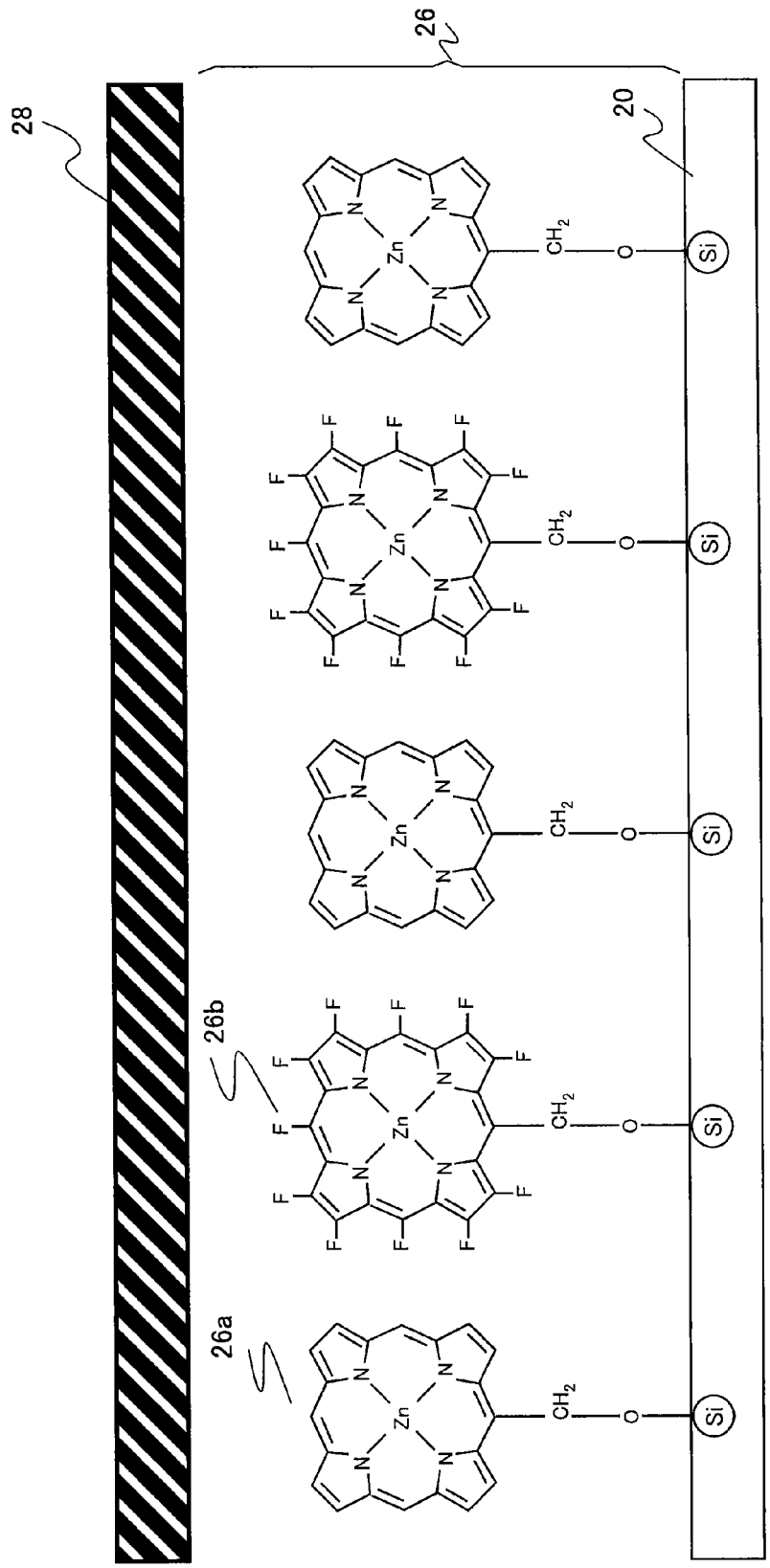
FIG. 20 is a schematic cross-sectional view of a memory cell portion of an organic molecular memory according to a fourth embodiment.

FIG. 20 is a schematic cross-sectional view of a memory cell (molecular cell) portion of the organic molecular memory of this embodiment.

The organic molecular layer 26 is formed with charge-storage molecular chains (the second organic molecules) 26a and organic molecules (the first organic molecules) 26b having electron-withdrawing substituents that are fluorine atoms (F) in this embodiment. The organic molecules 26b have different molecular structures from those of the charge-storage molecular chains 26a.

As shown in FIG. 20, the charge-storage molecular chains 26a are zinc porphyrin, for example. The organic molecules 26b having electron-withdrawing substituents are zinc porphyrin derivatives to which fluorine atoms (F) as the electron-withdrawing substituents are bound, for example. In this embodiment the organic molecules 26b have charge-storage molecular chains which have same carbon skeleton as that of the charge-storage molecular chains 26a.

In this embodiment, the organic molecules 26b have electron-withdrawing substituents, as shown in FIG. 20. Because of this, the organic molecular layer has higher relative permittivity than that in a case where the organic molecular layer is formed only with the charge-storage molecular chains 26a, for example. As a result, the charge retention properties of the organic molecular memory are improved by the same effects as those described in the first embodiment. Further, to improve the charge retention properties of the organic molecular memory, the relative permittivity is preferably 5.5 or higher, or more preferably, 6.0 or higher, as in the first embodiment.

The relative permittivity of the organic molecular layer 26 can be appropriately set by adjusting the molecular structures, placement densities, and the like of the charge-storage molecular chains 26a and the organic molecules 26b in the organic molecular layer 26.

The charge-storage molecular chains 26a and the organic molecules 26b of this embodiment are not limited to the above described structures. Any molecular chains that have a function to store charges in the molecular chains and can switch between a charge-stored state and a no-charge-stored state by application and removal of external voltage suffice as the charge-storage molecular chains 26a. For example, organic molecules having any of the molecule structures illustrated in FIGS. 18 and 19 can be provided. It should be noted that, in this embodiment, electron-withdrawing substituents may be or may not be bound to the charge-storage molecular chains 26a.

As the organic molecules 26b having electron-withdrawing substituents, organic molecules having any of the molecular structures illustrated in FIGS. 18 and 19 can be used. Other than the above, the organic molecules 26b may be the variable-resistance molecular chains having electron-withdrawing substituents described in the first embodiment, or organic molecules that are not charge-storage molecular chains or variable-resistance molecular chains and have electron-withdrawing substituents, such as the fluoroalkyl-thiol described in the second embodiment.

As shown in FIG. 20, derivatives of the charge-storage molecular chains 26a are used as the organic molecules 26b having electron-withdrawing substituents. In this manner, the organic molecular layer 26 having two kinds of organic molecules mixed therein can be easily formed as a self-assembled film.

EXAMPLES

In the following, examples are described.

Example

A self-assembled film of molecules with a flexible, large electric dipole moment is formed on a gold substrate by introducing four fluorine atoms to each of two phenyl groups that are located on and below molecules 4-[2-nitro-5-amino-4-(phenylethynyl)phenylethynyl]benzenethiol. These molecules are equivalent to the molecules of the first embodiment illustrated in FIG. 3. A gold electrode is formed on the molecules, to form an organic molecular memory.

A voltage is applied between the gold substrate and the gold electrode, to realize a variable-resistance memory operation. According to the results of measurement of current, the activation energy is 0.69 eV. The relative permittivity of the organic molecular layer formed with the self-assembled film is 6.0.

Permittivity is calculated in the following manner. A molecular film is formed on a gold substrate, and a metal electrode is formed on the molecular film by cooling a molecular film with liquid nitrogen, to form a sample. A triangular voltage with amplitude of 1 V at 1 kHz is applied to the sample, to obtain a current flow. The permittivity is calculated from the displacement current component of the current. That is, the current that flows when a triangular wave having a linearly-varying waveform is applied is a current in which a conduction current component and the component of a displacement current flowing in a capacitance are superimposed on each other. Of those currents, the conduction current component depends only on applied voltage, but the displacement current component depends on the time differentiation of the voltage waveform (since the voltage waveform is a triangular waveform, the absolute values are the same, and the sign changes from the positive sign to the negative sign). Accordingly, the conduction current component is represented by the sum of the current I1 obtained when the time component of the same voltage is positive and the current I2 obtained when the time component is negative, and the displacement current component is represented by the difference between the current I1 and the current I2. Since the displacement current component is equal to the product of capacitance and the first-order time differentiation of voltage (or twice the product, because the displacement current is doubled in the case of I1−I2), the capacitance can be determined. Since the capacitance is equal to the value obtained by dividing the product of permittivity and area by film thickness, the permittivity can be determined from the area and film thickness (or the length of the molecule in this example) of the sample to be measured.

Where the potential difference between the electrodes is set to a write voltage of 1.5 V, the resistance becomes higher, and current does not flow. By setting a read voltage to 1.0 V and reading the current as data at this voltage, an operation of the memory element can be checked. After writing, the electrodes are short-circuited, and reading is performed after a certain period of time. The charge retention time is then measured.

The charge retention time is one month or longer. This is supposedly because the molecule activation energy is as large as 0.69 eV due to introduction of fluorine as electron-withdrawing substituents.

Comparative Example

An organic molecular memory is manufactured and evaluated in the same manner as in Example, except that a self-assembled film of 4-[2-nitro-5-amino-4-(phenylethynyl)phenylethynyl]benzenethiol to which fluorine is not introduced is formed on a gold substrate.

According to the results of measurement of current, the activation energy is 0.23 eV. The relative permittivity of an organic molecular layer formed with the self-assembled film is 3.0. The charge retention time is almost the same as 440 seconds, which is disclosed in C. Li et. al, "Fabrication approach for molecular memory arrays", Appl. Phys. Lett., Vol. 82, No. 4, pp. 645-647 (2003).

As is apparent from a comparison between Example and Comparative Example, the charge retention properties are improved by introducing electron-withdrawing substituents into the organic molecular layer and increasing the relative permittivity.

In the embodiments and Example, the organic molecules forming each organic molecular layer are variable-resistance molecular chains, charge-storage molecular chains, or organic molecules having electron-withdrawing substituents. However, it should be noted that each organic molecular layer may contain other organic molecules as well as variable-resistance molecular chains, charge-storage molecular chains, or organic molecules having electron-withdrawing substituents.

Also, each organic molecular memory is not necessarily of a cross-point type or a stacked-gate type, but may have any other structure such as a three-dimensional structure.

While certain embodiments have been described, these embodiments have been presented by way of example only, and are not intended to limit the scope of the inventions. Indeed, organic molecular memories described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. An organic molecular memory comprising
a semiconductor layer;
an organic molecular layer formed above the semiconductor layer, the organic molecular layer including metal atoms, carbon atoms and halogen atoms, the metal atoms being distributed in the organic molecular layer, and one of the metal atoms surrounded by some of the carbon atoms and some of the halogen atoms, the halogen atoms being selected from the group of fluorine atoms, bromine atoms and iodine atoms;
an insulating layer formed above the organic layer; and
a gate electrode formed above the insulating layer.

2. The memory according to claim 1, wherein the organic molecular layer further includes nitrogen atoms.

3. The memory according to claim 1, wherein the organic molecular layer further includes nitrogen atoms, some of the nitrogen atoms are positioned closer to the one of the metal atoms, compared to the some of the halogen atoms.

4. The memory according to claim 1, wherein the metal atoms are copper atoms.

5. The memory according to claim 1, wherein the organic molecular layer is located closer to the semiconductor layer compared to the insulating layer.

6. The memory according to claim 1, wherein the organic molecular layer further includes a plurality of charge-storage molecular chains, and one end of the plurality of charge-storage molecular chains is chemically bound to the semiconductor layer.

7. The memory according to claim 1, wherein the organic molecular layer further includes a plurality of charge-storage molecular chains, and one of charge-storage molecular chains includes the one of the metal atoms surrounded by the some of the carbon atoms and the some of the halogen atoms.

8. The memory according to claim 1, wherein the organic molecular layer further includes a plurality of charge-storage molecular chains, one of charge-storage molecular chains includes a linker, and the linker is positioned at a semiconductor layer-side.

9. The memory according to claim 1, wherein the organic molecular layer further includes a plurality of charge-storage molecular chains, and one of charge-storage molecular chains includes a linker being chemically bound to the semiconductor layer.

10. The memory according to claim 1, wherein the semiconductor layer is a silicon substrate.

11. The memory according to claim 2, wherein the metal atoms are copper atoms.

12. An organic molecular memory comprising
a semiconductor layer;
an organic molecular layer formed above the semiconductor layer, the organic molecular layer including metal atoms, carbon atoms and halogen atoms, the metal atoms being distributed in the organic molecular layer, and one of the metal atoms surrounded by some of the carbon atoms and some of the halogen atoms;
an insulating layer formed above the organic layer; and
a gate electrode formed above the insulating layer,
wherein the metal atoms are atoms selected from the group of zinc atoms, iron atoms, cobalt atoms, nickel atoms, and copper atoms.

13. An organic molecular memory comprising
a semiconductor layer;
an organic molecular layer formed above the semiconductor layer, the organic molecular layer including metal atoms, carbon atoms and halogen atoms, the metal atoms being distributed in the organic molecular layer, and one of the metal atoms surrounded by some of the carbon atoms and some of the halogen atoms;
an insulating layer formed above the organic layer; and
a gate electrode formed above the insulating layer,
wherein the insulating layer has a film stack, the film stack being one of a film stack of a silicon oxide film, a silicon nitride film, and a high-permittivity film, a film stack of a silicon oxide film and a high-permittivity film, and a film stack of a silicon nitride film and a high-permittivity film.

14. An organic molecular memory comprising
a semiconductor layer;
an organic molecular layer formed above the semiconductor layer, the organic molecular layer including metal atoms, carbon atoms and halogen atoms, the metal atoms being distributed in the organic molecular layer, one of the metal atoms surrounded by first group of the carbon atoms and some of the halogen atoms, and another one of the metal atoms surrounded by second group of the carbon atoms, the halogen atoms being selected from the group of fluorine atoms, bromine atoms and iodine atoms;
an insulating layer formed above the organic layer; and
a gate electrode formed above the insulating layer.

15. The memory according to claim 14, wherein the organic molecular layer further includes nitrogen atoms.

16. The memory according to claim 14, wherein the organic molecular layer further includes nitrogen atoms, some of the nitrogen atoms are positioned closer to the one of the metal atoms, compared to the some of the halogen atoms.

17. The memory according to claim 14, wherein the metal atoms are copper atoms.

18. The memory according to claim 14, wherein the organic molecular layer is located closer to the semiconductor layer compared to the insulating layer.

19. The memory according to claim 14, wherein the organic molecular layer further includes a plurality of charge-storage molecular chains, and one end of the plurality of charge-storage molecular chains is chemically bound to the semiconductor layer.

20. The memory according to claim 14, wherein the organic molecular layer further includes a plurality of charge-storage molecular chains, one of charge-storage molecular chains includes the one of the metal atoms surrounded by the first group of the carbon atoms and the some of the halogen atoms, and another one of charge-storage molecular chains includes the another one of the metal atoms surrounded by the second group of the carbon atoms.

21. The memory according to claim 14, wherein the organic molecular layer further includes a plurality of charge-storage molecular chains, one of charge-storage molecular chains includes a linker, and the linker is positioned at a semiconductor layer-side.

22. The memory according to claim 14, wherein the organic molecular layer further includes a plurality of charge-storage molecular chains, and one of charge-storage molecular chains includes a linker being chemically bound to the semiconductor layer.

23. The memory according to claim 14, wherein the semiconductor layer is a silicon substrate.

24. The memory according to claim 15, wherein the metal atoms are copper atoms.

25. An organic molecular memory comprising
a semiconductor layer;
an organic molecular layer formed above the semiconductor layer, the organic molecular layer including metal atoms, carbon atoms and halogen atoms, the metal atoms being distributed in the organic molecular layer, one of the metal atoms surrounded by first group of the carbon atoms and some of the halogen atoms, and another one of the metal atoms surrounded by second group of the carbon atoms;
an insulating layer formed above the organic layer; and
a gate electrode formed above the insulating layer,
wherein the metal atoms are atoms selected from the group of zinc atoms, iron atoms, cobalt atoms, nickel atoms, and copper atoms.

26. An organic molecular memory comprising
a semiconductor layer;
an organic molecular layer formed above the semiconductor layer, the organic molecular layer including metal atoms, carbon atoms and halogen atoms, the metal atoms being distributed in the organic molecular layer, one of the metal atoms surrounded by first group of the carbon atoms and some of the halogen atoms, and another one of the metal atoms surrounded by second group of the carbon atoms;
an insulating layer formed above the organic layer; and
a gate electrode formed above the insulating layer,
wherein the insulating layer has a film stack, the film stack being one of a film stack of a silicon oxide film, a silicon nitride film, and a high-permittivity film, a film stack of a silicon oxide film and a high-permittivity film, and a film stack of a silicon nitride film and a high-permittivity film.

* * * * *